US011026352B2

(12) United States Patent
Matte et al.

(10) Patent No.: US 11,026,352 B2
(45) Date of Patent: Jun. 1, 2021

(54) CLOSED LOOP COOLING SYSTEM FOR A JUNCTION BOX IN A VEHICLE, AND RELATED COMPONENTS, SYSTEMS, AND METHODS

(71) Applicant: Volvo Group Canada Inc., Sainte-Claire (CA)

(72) Inventors: François Matte, Quebec (CA); Pascal Duguay, Quebec (CA); René Lamothe, Lévis (CA)

(73) Assignee: VOLVO TRUCK CORPORATION, Gothenburg (SE)

( * ) Notice: Subject to any disclaimer, the term of this patent is extended or adjusted under 35 U.S.C. 154(b) by 210 days.

(21) Appl. No.: 16/313,411

(22) PCT Filed: Jun. 27, 2016

(86) PCT No.: PCT/CA2016/000178
§ 371 (c)(1),
(2) Date: Dec. 26, 2018

(87) PCT Pub. No.: WO2018/000072
PCT Pub. Date: Jan. 4, 2018

(65) Prior Publication Data
US 2019/0230824 A1 Jul. 25, 2019

(51) Int. Cl.
*H05K 7/20* (2006.01)
*H02G 3/03* (2006.01)
(Continued)

(52) U.S. Cl.
CPC ..... *H05K 7/20863* (2013.01); *B60H 1/00271* (2013.01); *B60H 1/241* (2013.01);
(Continued)

(58) Field of Classification Search
CPC ........ B64D 13/00; B64D 13/02; B64D 13/04; H05K 7/20863; H05K 7/20845;
(Continued)

(56) References Cited

U.S. PATENT DOCUMENTS 6,082,879 A * 7/2000 Myburgh ................. B60Q 3/47
362/253
2009/0095449 A1 4/2009 Bandai et al.
(Continued)

FOREIGN PATENT DOCUMENTS

DE 102009042698 A1 4/2010
JP 2004215388 A 7/2004
(Continued)

OTHER PUBLICATIONS

International Search Report and Written Opinion for PCT/CA2016/000178, dated Aug. 8, 2016, 7 pages.

*Primary Examiner* — Vivek K Shirsat
(74) *Attorney, Agent, or Firm* — Withrow & Terranova PLLC

(57) ABSTRACT

A closed loop cooling system for a junction box in a vehicle includes a junction box housing and a storage compartment for a vehicle. A cool air duct interior volume of a cool air duct and a warm air duct interior volume of a warm air duct are each in fluidic communication with a housing interior volume of the junction box housing and a compartment interior volume of the storage compartment to form a closed loop cooling system. The cool air duct interior volume is sized to convey cool air from a cool air outlet of the storage compartment to a cool air inlet of the junction box housing, and the warm air duct interior volume is sized to convey warm air, which is warmer than the cool air, from a warm air outlet of the junction box housing to a warm air inlet of the storage compartment.

19 Claims, 8 Drawing Sheets

(51) Int. Cl.
    *H02G 3/08*           (2006.01)
    *B60H 1/00*           (2006.01)
    *B60R 16/023*        (2006.01)
    *B60H 1/24*           (2006.01)

(52) U.S. Cl.
    CPC ......... *B60H 1/246* (2013.01); *B60R 16/0238* (2013.01); *H02G 3/03* (2013.01); *H02G 3/08* (2013.01); *H05K 7/20145* (2013.01); *H05K 7/20172* (2013.01); *B60H 2001/003* (2013.01); *B60Y 2200/143* (2013.01)

(58) Field of Classification Search
    CPC .... B60H 1/00271; B60H 1/246; B60H 1/241; B60R 16/0238
    USPC .......................................... 454/100; 165/80.2
    See application file for complete search history.

(56) References Cited

U.S. PATENT DOCUMENTS

| | | | |
|---|---|---|---|
| 2009/0176150 A1* | 7/2009 | Yanaka | H01M 10/613 |
| | | | 429/120 |
| 2016/0211561 A1* | 7/2016 | Nakagawa | H01M 10/6566 |
| 2017/0087972 A1* | 3/2017 | Hara | B62D 25/2027 |

FOREIGN PATENT DOCUMENTS

| | | |
|---|---|---|
| JP | 20042748430 | 9/2004 |
| JP | 2009292391 A | 12/2009 |
| JP | 2011125172 A | 6/2011 |

\* cited by examiner

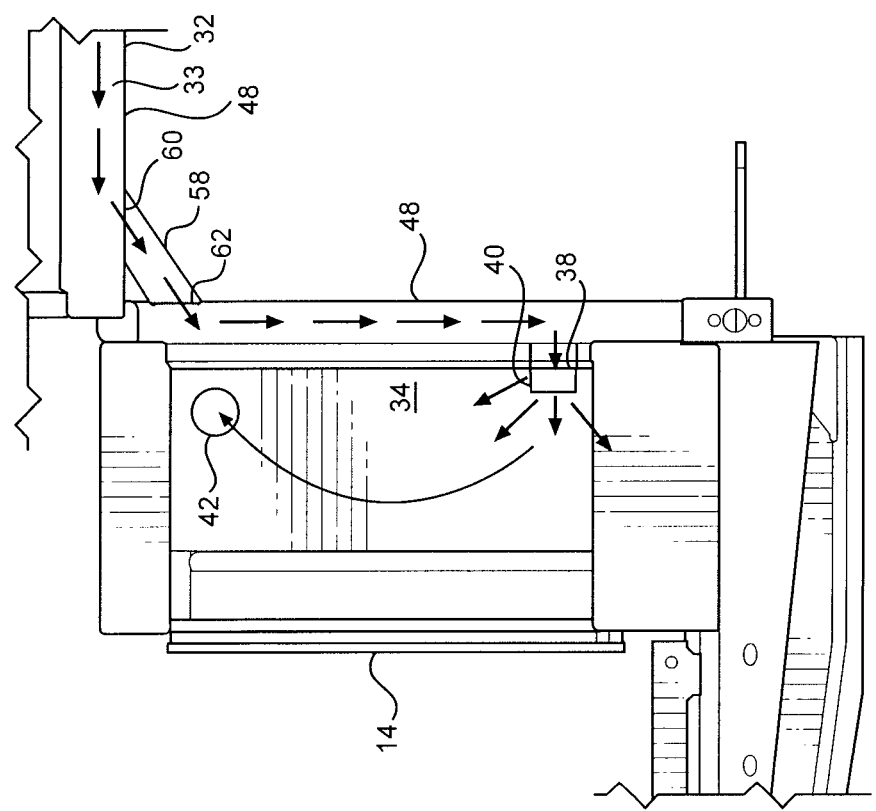

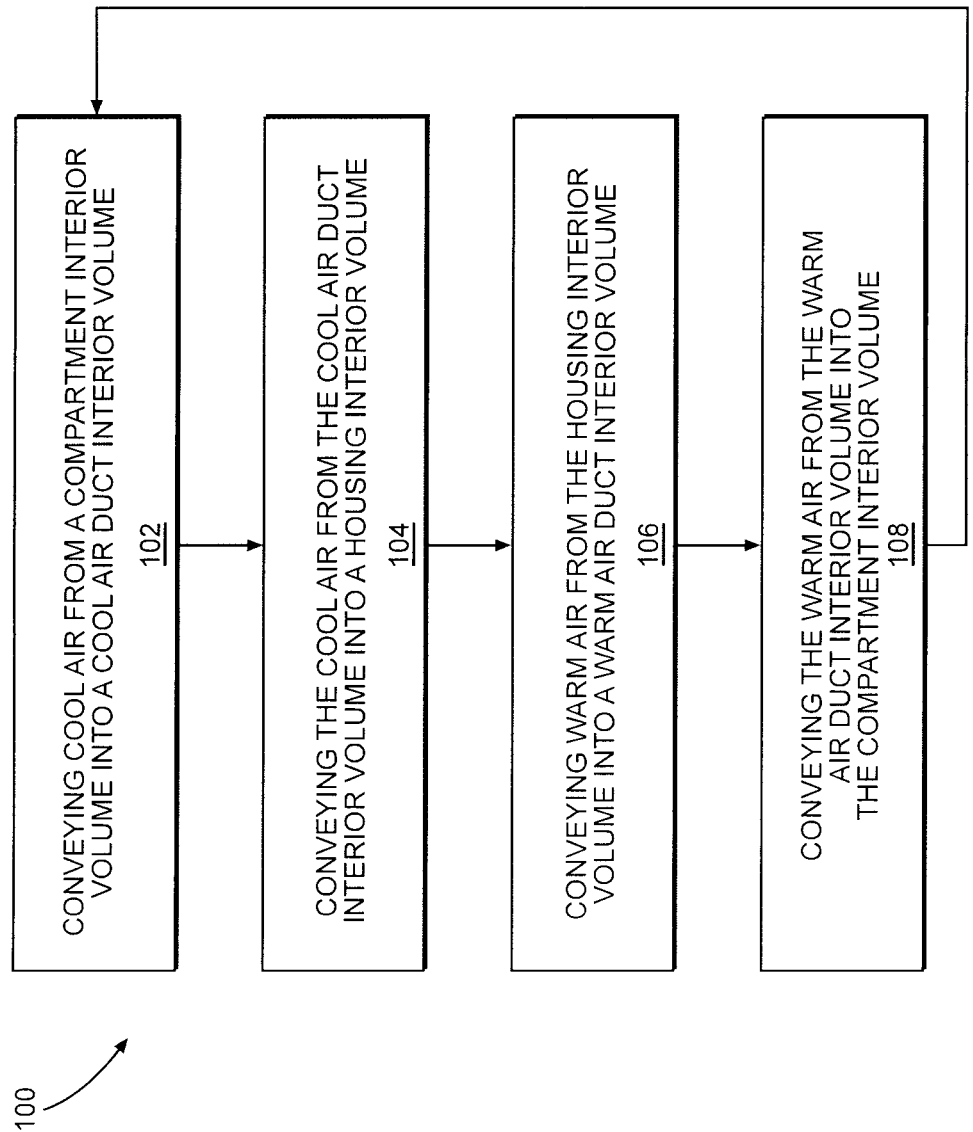

CLOSED LOOP COOLING SYSTEM FOR A JUNCTION BOX IN A VEHICLE, AND RELATED COMPONENTS, SYSTEMS, AND METHODS

This application is a 35 USC 371 National Phase filing of International Application No. PCT/CA2016/000178, filed Jun. 27, 2016, the disclosure of which is incorporated herein by reference in its entirety.

FIELD OF THE DISCLOSURE

The present disclosure relates generally to a cooling system for a junction box, and more particularly to a closed loop cooling system for a junction box in a vehicle, and related components, systems, and methods.

BACKGROUND

Junction boxes, such as electrical junction boxes for large commercial vehicles, typically house electrical equipment and components. Electrical compartments in these types of vehicles may be subject to harsh environmental conditions, including exposure to moisture, chemicals and other environmental contaminants that can damage and shorten the operational life of the electrical equipment and components. A closed junction box can protect against many of these contaminants, but typical junction boxes tend to retain significant amounts of heat given off by the electrical components, which can also damage and shorten the operational life of the electrical equipment and components. Thus, there is a need for a cooling and ventilation system for a junction box in a vehicle that can keep the electrical equipment and components within the junction box cool without exposing the electrical equipment and components to outside environmental conditions and contaminants that may be present in the electrical compartment around the junction box.

SUMMARY

The present disclosure is directed to a cooling system for a junction box, and more particularly to a closed loop cooling system for a junction box in a vehicle, and related components, systems, and methods. In one embodiment a closed loop cooling system comprises a junction box housing sized to house electrical equipment in a vehicle and a storage compartment for a vehicle. An interior volume of a cool air duct and an interior volume of a warm air duct are each in fluidic communication with a housing interior volume of the junction box housing and a compartment interior volume of the storage compartment to form a closed loop cooling system. The interior volume of the cool air duct is sized to convey cool air from a cool air outlet of the storage compartment to a cool air inlet of the junction box housing, and the interior volume of the warm air duct is sized to convey warm air, which is warmer than the cool air, from a warm air outlet of the junction box housing to a warm air inlet of the storage compartment.

One advantage of this arrangement is that the storage compartment, which may be a luggage compartment or a motor coach baggage hold, for example, may contain a relatively large volume of source air at a stable air temperature. A portion of the source air is conveyed from the storage compartment into the junction box housing as cool air. The cool air absorbs heat generated by the electrical equipment in the junction box housing, thereby cooling the electrical equipment and increasing the temperature of the cool air to form the warm air. The warm air is conveyed into the storage compartment and comingles with the source air in the compartment interior volume. Excess heat from the warm air is absorbed into the relatively large volume of source air, and the temperature of the warm air normalizes to the lower temperature of the source air. This closed loop arrangement in this embodiment allows the cooling system to operate without introducing outside air into the system, which reduces exposure of the electrical components to outside moisture, chemicals, or other contaminants.

According to one embodiment, a closed loop cooling system for a junction box in a vehicle is disclosed. The system comprises a junction box housing sized to house electrical equipment in a vehicle, the junction box housing forming a housing interior volume. The system further comprises a storage compartment for a vehicle, the storage compartment forming a compartment interior volume. The system further comprises a cool air duct coupled between the storage compartment and the junction box housing. The cool air duct forms a cool air duct interior volume in fluidic communication with the compartment interior volume and the housing interior volume. The cool air duct interior volume is sized to convey cool air having a first temperature from the compartment interior volume into the housing interior volume. The system further comprises a warm air duct coupled between the junction box housing and the storage compartment. The warm air duct forms a warm air duct interior volume in fluidic communication with the housing interior volume and the compartment interior volume. The warm air duct interior volume is sized to convey warm air having a second temperature higher than the first temperature from the housing interior volume into the compartment interior volume.

According to another embodiment, a method of operating a closed loop cooling system for a junction box in a vehicle is disclosed. The method comprises conveying cool air having a first temperature from a compartment interior volume of a storage compartment of a vehicle into a cool air duct interior volume of a cool air duct, the cool air duct interior volume in fluidic communication with the compartment interior volume. The method further comprises conveying the cool air from the cool air duct interior volume into a housing interior volume of a junction box housing in fluidic communication with the cool air duct interior volume, wherein the cool air is warmed into warm air having a second temperature higher than the first temperature. The method further comprises conveying the warm air from the housing interior volume into a warm air duct interior volume in fluidic communication with the housing interior volume and the compartment interior volume. The method further comprises conveying the warm air from the warm air duct interior volume into the compartment interior volume.

Those skilled in the art will appreciate the scope of the present disclosure and realize additional aspects thereof after reading the following detailed description of the preferred embodiments in association with the accompanying drawings.

BRIEF DESCRIPTION OF THE DRAWINGS

FIG. 5 is a cross-sectional view of the junction box housing and a portion of the cool air duct showing the use of structural members of the vehicle to form the cool air duct, according to an embodiment;

FIG. 7 is a flowchart diagram illustrating a method of operating a closed loop cooling system, such as the closed loop cooling systems of FIGS. 1-6, according to an embodiment.

DETAILED DESCRIPTION

Figure 1:
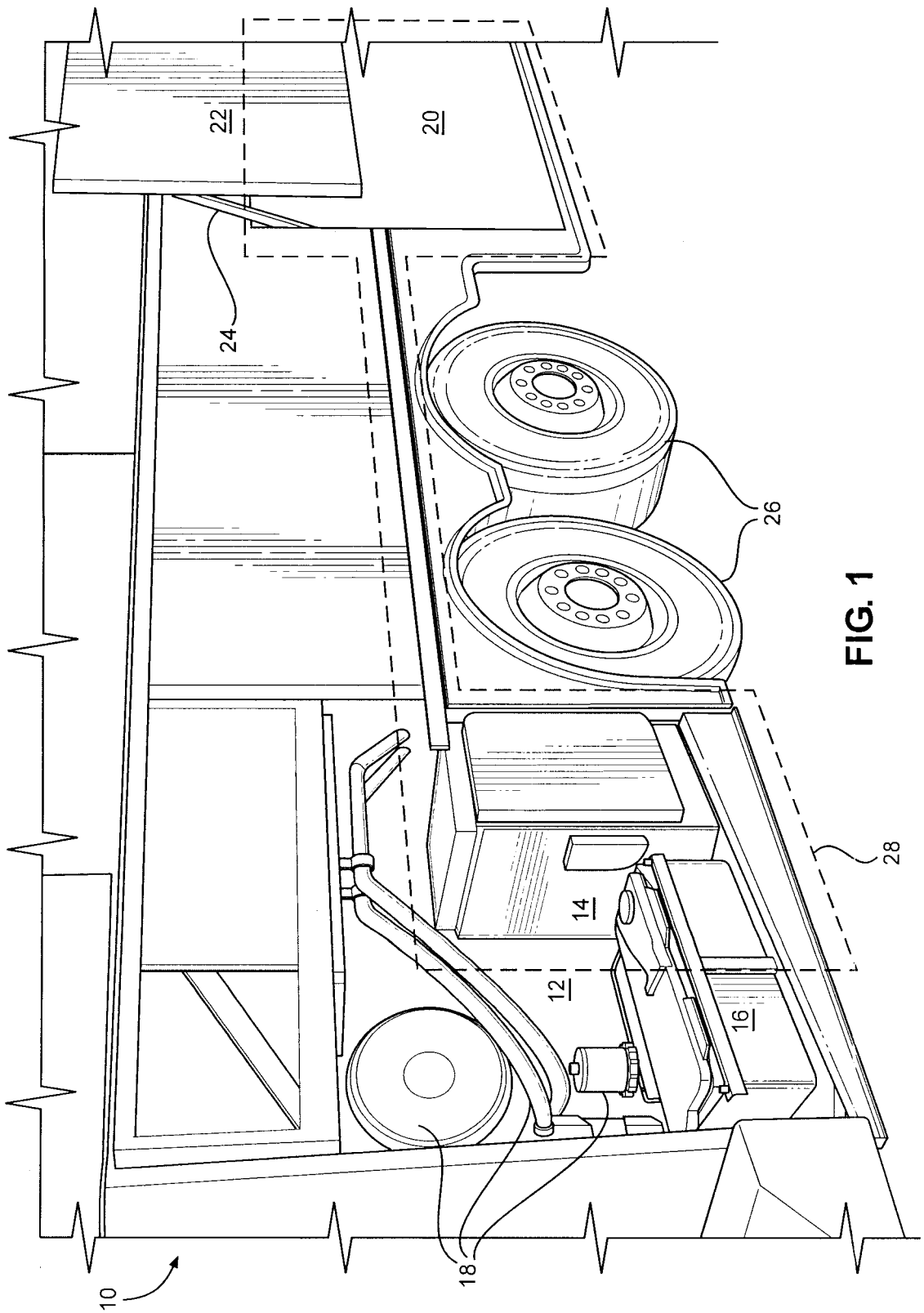
FIG. 1 is a perspective view of a motor coach electrical compartment having a closed loop cooling system according to an embodiment.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the embodiments are not limited to any particular sequence of steps. The use herein of ordinals in conjunction with an element is solely for distinguishing what might otherwise be similar or identical labels, such as "first temperature" and "second temperature," and does not imply a priority, a type, an importance, or other attribute, unless otherwise stated herein. The term "about" used herein in conjunction with a numeric value means any value that is within a range of ten percent greater than or ten percent less than the numeric value.

The present disclosure is directed to a cooling system for a junction box, and more particularly to a closed loop cooling system for a junction box in a vehicle, and related components, systems, and methods. In one embodiment a closed loop cooling system comprises a junction box housing sized to house electrical equipment in a vehicle and a storage compartment for a vehicle. An interior volume of a cool air duct and an interior volume of a warm air duct are each in fluidic communication with a housing interior volume of the junction box housing and a compartment interior volume of the storage compartment to form a closed loop cooling system. The interior volume of the cool air duct is sized to convey cool air from a cool air outlet of the storage compartment to a cool air inlet of the junction box housing, and the interior volume of the warm air duct is sized to convey warm air, which is warmer than the cool air, from a warm air outlet of the junction box housing to a warm air inlet of the storage compartment.

One advantage of this arrangement is that the storage compartment, which may be a luggage compartment or a motor coach baggage hold, for example, may contain a relatively large volume of source air at a stable air temperature. A portion of the source air is conveyed from the storage compartment into the junction box housing as cool air. The cool air absorbs heat generated by the electrical equipment in the junction box housing, thereby cooling the electrical equipment and increasing the temperature of the cool air to form the warm air. The warm air is conveyed into the storage compartment and comingles with the source air in the compartment interior volume. Excess heat from the warm air is absorbed into the relatively large volume of source air, and the temperature of the warm air normalizes to the lower temperature of the source air. This closed loop arrangement in this embodiment allows the cooling system to operate without introducing outside air into the system, which reduces exposure of the electrical components to outside moisture, chemicals, or other contaminants.

In this regard, FIG. 1 illustrates a vehicle 10 having an electrical compartment 12 containing a junction box housing 14. The electrical compartment 12, which is a rear electrical compartment for a motor coach in this embodiment, also includes one or more batteries 16 and other vehicle components 18. The vehicle 10 in this embodiment also includes a storage compartment 20, which may be a luggage compartment or baggage hold for example. In this embodiment, the storage compartment is a baggage hold for a motor coach having one or more side doors 22 movably coupled to the vehicle 10 by a plurality of hinge mechanisms 24. In this embodiment, the electrical compartment 12 and junction box housing 14 are located behind rear wheels 26 of the vehicle 10, and the storage compartment 20 is located in front of the rear wheels 26, but other configurations are possible.

Figure 2:
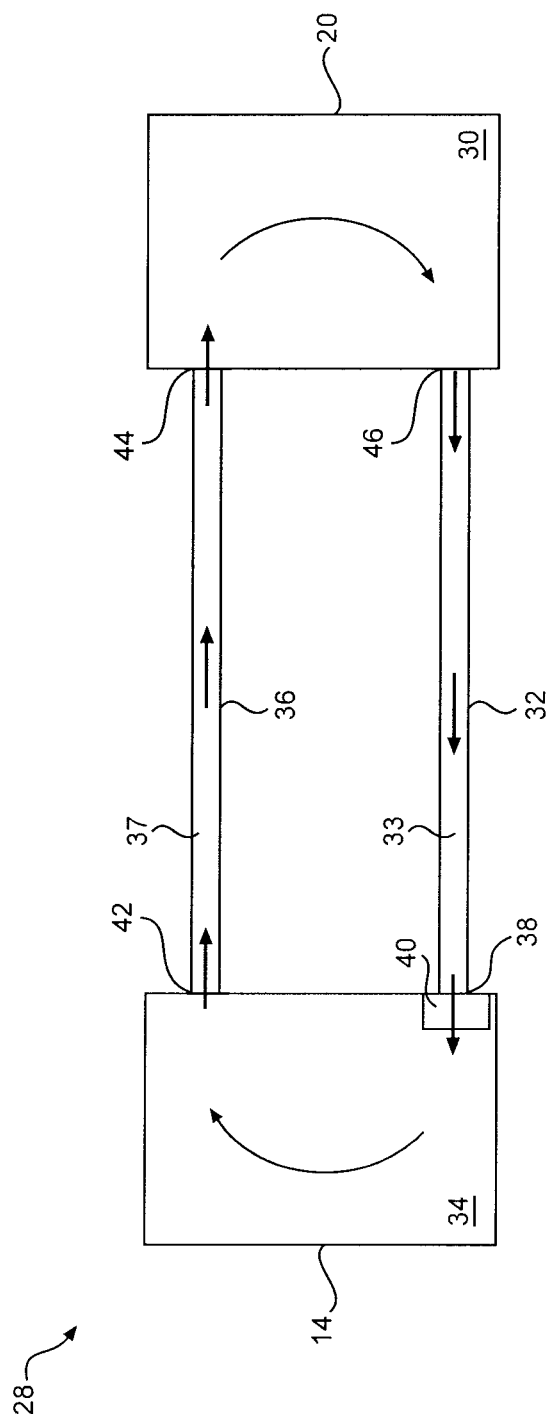
FIG. 2 is a simplified schematic diagram of the closed loop cooling system of FIG. 1 showing the cool air duct and warm air duct for conveying air between the junction box housing and the storage compartment, according to an embodiment.

The junction box housing 14 and storage compartment 20 form part of a closed loop cooling system 28. In this regard, FIG. 2 illustrates a simplified schematic view of the closed loop cooling system 28. As noted above, the closed loop cooling system 28 includes the junction box housing 14, which is sized to house electrical equipment in the vehicle 10, and a storage compartment 20, which includes a relatively large compartment interior volume 30. A cool air duct 32 has a cool air duct interior volume 33 that is in fluidic communication with the compartment interior volume 30 of the storage compartment 20 and a housing interior volume 34 of the junction box housing 14. A warm air duct 36 has a warm air duct interior volume 37 that is in fluidic communication with the housing interior volume 34 and the compartment interior volume 30.

The storage compartment 20, the cool air duct 32, the junction box housing 14, and the warm air duct 36 form the closed loop cooling system 28. As used herein, an interior volume may be a void, channel, or other space formed in a structural element, and the interior volume may be in fluidic communication with another interior volume or another volume. Thus, in this embodiment, the cool air duct 32 is a structural component that may be coupled between the junction box housing 14 and the storage compartment 20. In this embodiment as well, the cool air duct interior volume 33 is a channel formed within the cool air duct 32, and the cool air duct interior volume 33 is in fluidic communication with the housing interior volume 34 and the compartment interior volume 30.

As used herein, elements that are in fluidic communication with each other are connected to each other such that a flow of a fluid from one element to the other is facilitated. In some embodiments, the flow of the fluid, such as air for example, may be facilitated by a pressure or flow of the fluid in one or more defined pathways, such as the interior volumes discussed above, for example. For example, a pressure differential caused by the fan 40 may cause air to flow through the defined pathways of the cool air duct interior volume 33, housing interior volume 34, warm air duct interior volume 37, and compartment interior volume 30 in a closed loop path through the closed loop cooling system 28.

In this embodiment, the junction box has a cool air housing inlet 38 in fluidic communication with the cool air duct interior volume 33 and the housing interior volume 34. In this embodiment, a fan 40 is disposed proximate to the cool air housing inlet 38 to draw cool air through the cool air housing inlet 38 into the housing interior volume 34. The junction box housing 14 also has a warm air housing outlet 42 in fluidic communication with the housing interior volume 34 and the warm air duct interior volume 37, for conveying warm air out of the housing interior volume 34, and into the warm air duct interior volume 37. The warm air is conveyed into the compartment interior volume 30 through a warm air housing inlet 44 in fluidic communication with the warm air duct interior volume 37 and the compartment interior volume 30, where it mixes with cooler source air in the compartment interior volume 30. The source air is conveyed into the cool air duct interior volume 33 through a cool air compartment outlet 46 in fluidic communication with the compartment interior volume 30 and the cool air duct interior volume 33. As used herein, cool air is a relative term referring to air having a first temperature, and warm air is a relative term referring to air having a second temperature higher than the first temperature. For example, in this embodiment, cool air may be air having a temperature of about 70° F., and warm air may be air having a temperature of about 90° F., but it should be understood that the disclosure is not so limited. As used herein, warm air and cool air may refer to any two volumes of air having differing temperatures.

Figure 3:
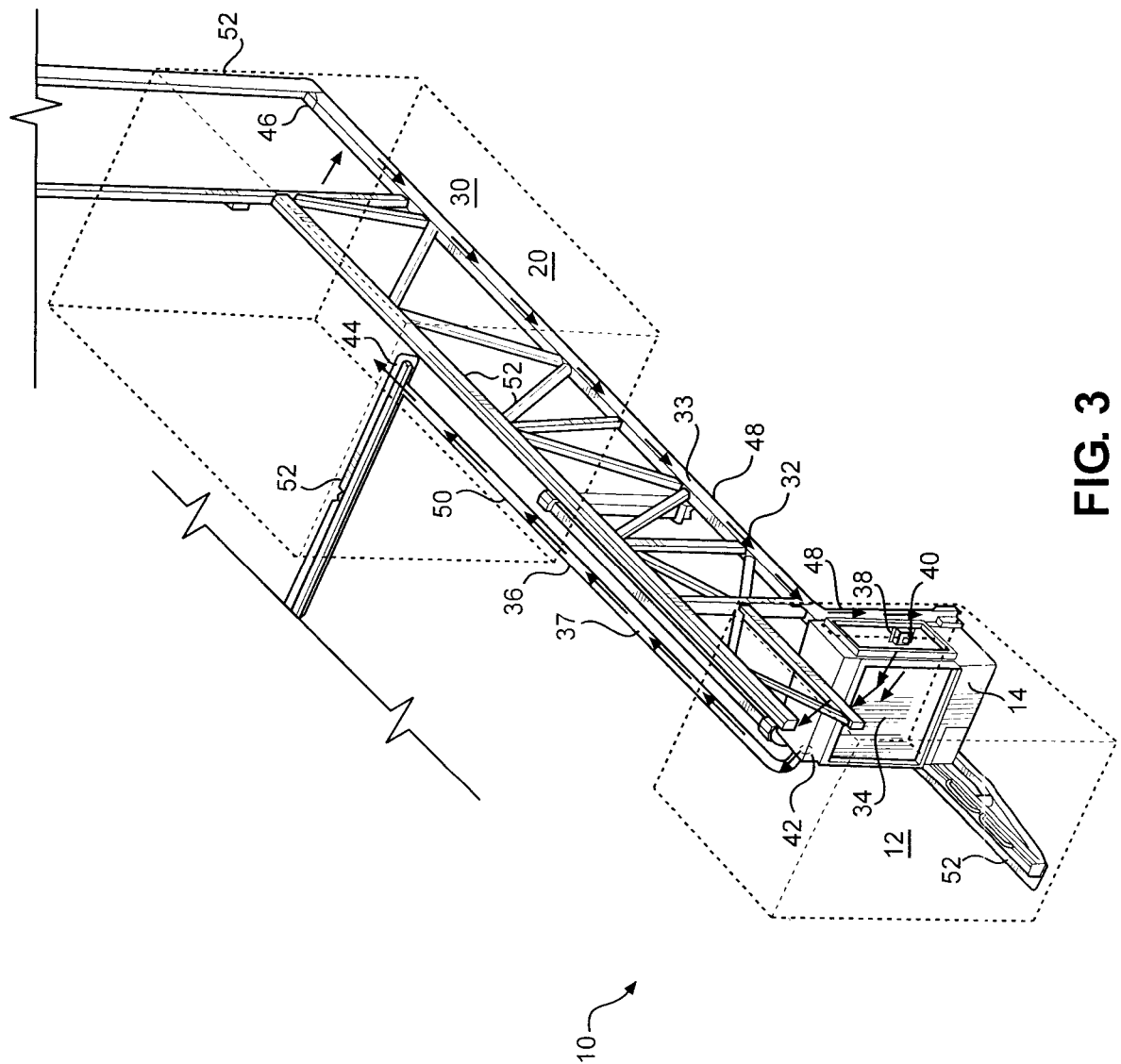
FIG. 3 is a perspective view of the closed loop cooling system of FIGS. 1 and 2 illustrating the use of structural members of the vehicle as the cool air duct, and the use of cable conduit as the warm air duct, according to an embodiment.

In some embodiments, existing components of the vehicle 10 may be adapted to be used as the cool air duct 32 and/or the warm air duct 36. In this regard, FIG. 3 illustrates a perspective view of the closed loop cooling system 28 of FIGS. 1 and 2, in which one or more hollow structural members 48 of the vehicle 10 may be used as the cool air duct 32, and in which one or more cable conduits 50 may be used as the warm air duct 36, according to an embodiment. In this embodiment, the hollow structural members 48 work together with other structural members 52 of the vehicle 10 to provide structural support for the vehicle 10. For example, in this embodiment, the hollow structural members 48 and illustrated other structural members 52 form part of a support frame for the body of a motor coach.

In some embodiments, an existing vehicle 10 may be retrofitted to adapt existing hollow structural members 48 for use as the cool air duct 32 or warm air duct 36. For example, to convert an existing set of structural members 48 into a cool air duct 32, a cool air housing inlet 38 may be formed in an existing hollow structural member 48 of the vehicle 10 adjacent to the junction box housing 14, to allow fluid communication between a hollow interior of the structural member 48 and the housing interior volume 34. Similarly, a cool air compartment outlet 46 may be formed in another structural member 48 of the vehicle 10 adjacent to the storage compartment 20, to allow fluidic communication between a hollow interior of the structural member 48 and the compartment interior volume 30. The hollow interiors of the structural members 48 may already be in fluidic communication with each other, or passages (not shown) between adjacent structural members 48 may alternatively be formed so that the cool air compartment outlet 46 of the storage compartment 20 is in fluidic communication with the cool air housing inlet 38 of the junction box housing 14. Similar retrofitting may be performed on the cable conduit 50 to form the warm air duct 36.

Alternatively, in other embodiments, the structural members 48 and/or cable conduit 50 may be arranged to form the cool air duct 32 and warm air duct 36 in the vehicle design phase. For example, the structural members 48 may be designed to provide structural support for the vehicle 10 and simultaneously provide an efficient fluid path for the cool air duct interior volume 33 between the compartment interior volume 30 and the housing interior volume 34. Similarly, the cable conduit 50 may be designed to provide efficient routing of cables therethrough for use by the vehicle 10 and simultaneously provide an efficient fluid path for the warm air duct interior volume 37 between the housing interior volume 34 and the compartment interior volume 30.

One advantage of using structural members 48 and/or cable conduits 50 of the vehicle 10 for use as the cool air duct 32 and/or warm air duct 36 is that the closed loop cooling system 28 may be incorporated into many existing vehicle 10 designs while minimizing added costs and complexity. In many vehicle 10 designs, structural members 48 and cable conduits 50 are already present, and can be easily reconfigured to also be used as the cool air duct 32 and the warm air duct 36 without impacting the primary functions of the structural members 48 and cable conduits 50. Similarly, many vehicle 10 designs already include a relatively large storage compartment 20, such as a baggage hold for a motor coach. Even when these storage compartments 20 are filled to capacity, e.g., with passenger luggage, the storage compartment may still provide a significant volume of source air sufficient to provide cooling for the relatively small volume of warm air being conveyed through the warm air duct interior volume 37 into the storage compartment 20. The closed loop design also allows the closed loop cooling system 28 to be operated without the need for an air filter along the path of the closed loop cooling system 28, because dust and other contaminants are not being introduced into the closed loop cooling system 28 by an outside air source. This in turn reduces the maintenance and component costs of the closed loop cooling system 28.

In addition to eliminating the need for dedicated air ducts for the closed loop cooling system 28, another advantage of using structural members 48 and/or cable conduits 50 of the vehicle 10 for use as the cool air duct 32 and/or warm air duct 36 is that the structural members 48 and/or cable conduits 50 may also act as heatsinks to further cool the air being conveyed through the closed loop cooling system 28. For example, the structural members 48 may be composed from a thermally conductive metal, such as steel or aluminum for example. In many vehicle applications, a temperature of the structural members 48 in the vehicle 10 may be significantly lower during normal use than the warm air being conveyed out of the junction box housing 14. As air is conveyed through the closed loop cooling system 28, warm air that is in contact with the structural members 48 may be further cooled by the structural members 48, which may in turn transfer and dissipate the excess heat through the other structural members 52 of the vehicle 10 and/or with the outside environment. Similarly, metal or other thermally conductive materials may be used in the cable conduit 50, which may also facilitate cooling of warm air being conveyed through the closed loop cooling system 28.

Figure 4A:
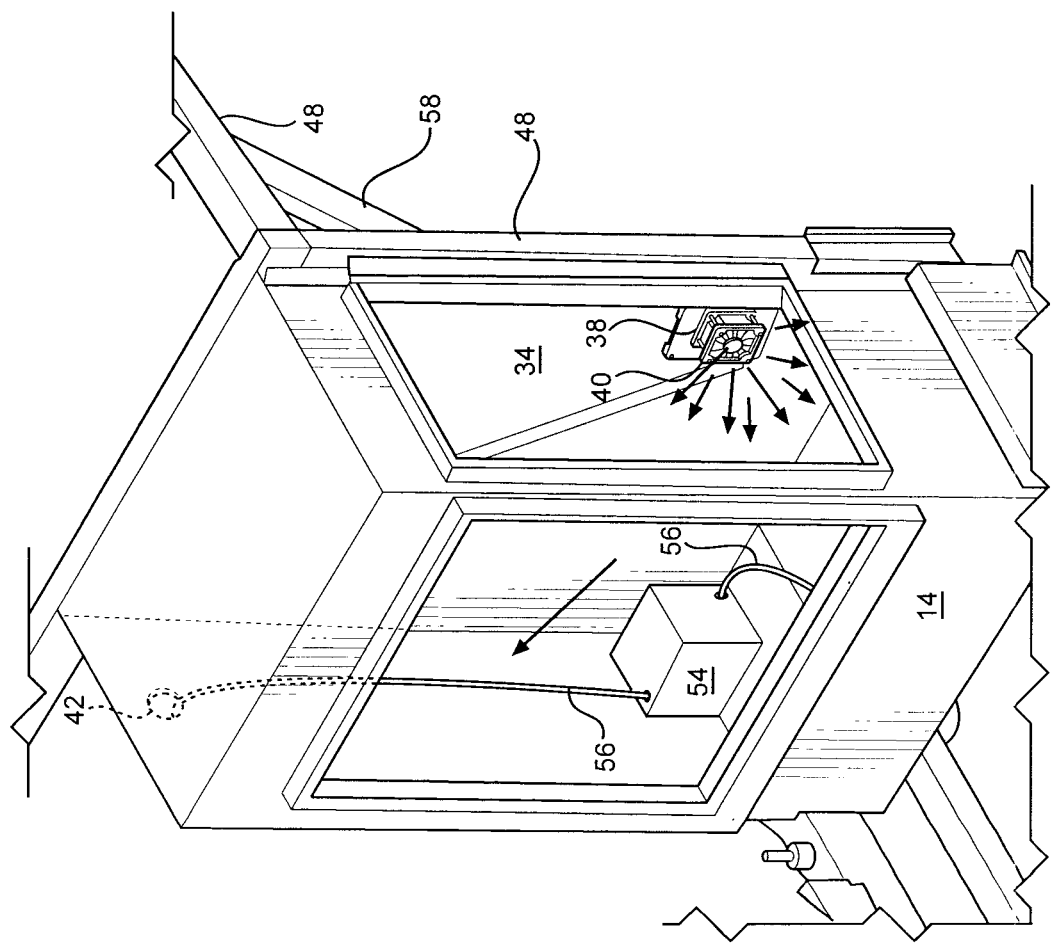
FIGS. 4A and 4B are detailed views of the junction box housing of the closed loop cooling system of FIGS. 1-3 illustrating movement of cool air into the junction box housing through the cool air inlet and movement of warm air out of the junction box housing through the warm air outlet, according to an embodiment.
Figure 4B:
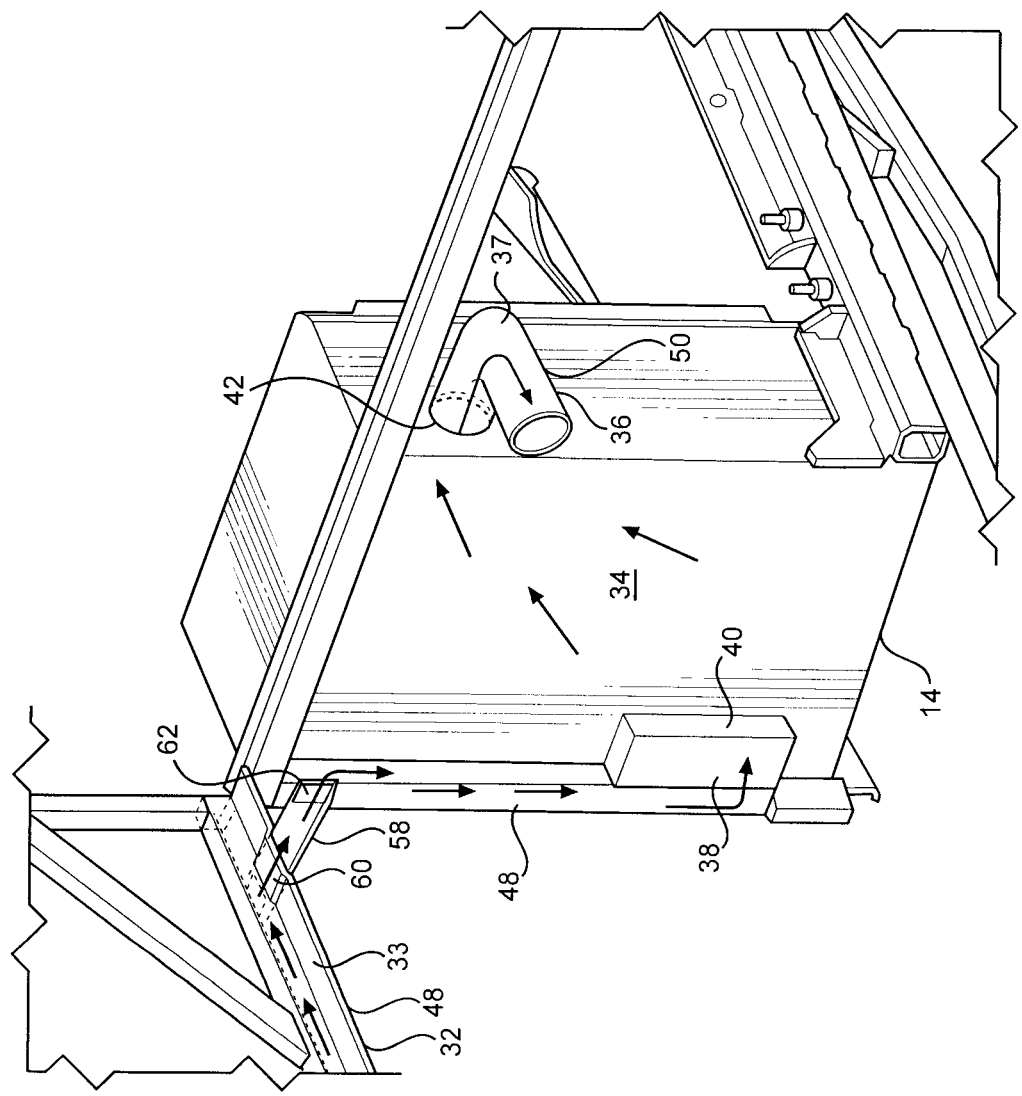

In this embodiment, the cool air housing inlet 38 and warm air housing outlet 42 are positioned with respect to the junction box housing 14 to efficiently convey cool air into the junction box housing 14 and to convey warm air out of the junction box housing 14 while minimizing energy usage by the fan 40 and any other additional active components that may be used in the closed loop cooling system 28. In this regard, FIGS. 4A and 4B are detailed views of the junction box housing 14 of the closed loop cooling system 28 of FIGS. 1-3 illustrating movement of cool air into the junction box housing 14 through the cool air housing inlet 38 and movement of warm air out of the junction box housing 14 through the warm air housing outlet 42, according to an embodiment. In this embodiment, the cool air housing inlet 38 and the fan 40 are disposed near a bottom of the housing interior volume 34. During operation, the cool air drawn into the housing interior volume 34 through the cool air housing inlet 38 by the fan 40. Electrical equipment 54 disposed in the junction box housing 14 includes electrical cables 56, which may be carried by the cable conduit 50. Operation of the electrical equipment 54 causes the average temperature in the housing interior volume 34 to increase, such that the average air temperature in the housing interior volume 34 is higher than the temperature of the cool air being drawn into the housing interior volume 34 by the fan 40. In this embodiment, several hollow structural members 48 form the cool air duct 32. Additionally, a hollow bracing member 58 may also be coupled between a first structural member duct junction 60 and a second structural member duct junction 62, to reduce a total length of the cool air duct interior volume 33 and to reduce size of the angles around which the cool air flows through the cool air duct interior volume 33. This in turn reduces the energy required to convey the cool air through the cool air duct interior volume 33, thereby allowing the fan 40 to convey the cool air at a higher rate, which may be expressed as cubic feet per minute (CFM), for example. In some embodiments, the fan 40 may be omitted, allowing the closed loop cooling system 28 to operate passively. For example, the natural tendency of warm air to rise may be sufficient to move the warm air out the upwardly located warm air housing outlet 42, thereby causing a pressure differential drawing cool air in from the cool air housing inlet 38. In this embodiment, however, the use of a fan 40 at the cool air housing inlet 38 significantly increases operational efficiency, making the closed loop cooling system 28 more suitable for larger applications, such as large commercial vehicles 10.

The cool air being drawn into the junction box housing 14 by the fan 40 has a higher density than the warm air already present in the housing interior volume 34, and the cool air forces the warm air upward as a result, with the warmest (and least dense) air collecting near a top of the housing interior volume 34. In this embodiment, the warm air housing outlet 42 is disposed near the top of the housing interior volume 34, such that the warmest air is pushed out of the junction box housing 14 through the warm air housing outlet 42 into the warm air duct interior volume 37. The warm air is then conveyed into the storage compartment through the warm air housing inlet 44 where it is cooled by the cooler source air in the compartment interior volume 30 (not shown).

Referring back to the structural members 48 and the bracing member 58, FIG. 5 is a cross-sectional view of the junction box housing 14 and a portion of the cool air duct 32 showing the arrangement of some of the structural members 48 and bracing member 58. As discussed above, bracing member 58 has a primary function of adding structural rigidity to the structural members 48 of the vehicle 10. As discussed above, in this embodiment, the bracing member 58 also reduces the angles within the cool air duct interior volume 33, thereby reducing the energy requirements for conveying the cool air through the cool air duct interior volume 33.

Figure 6:
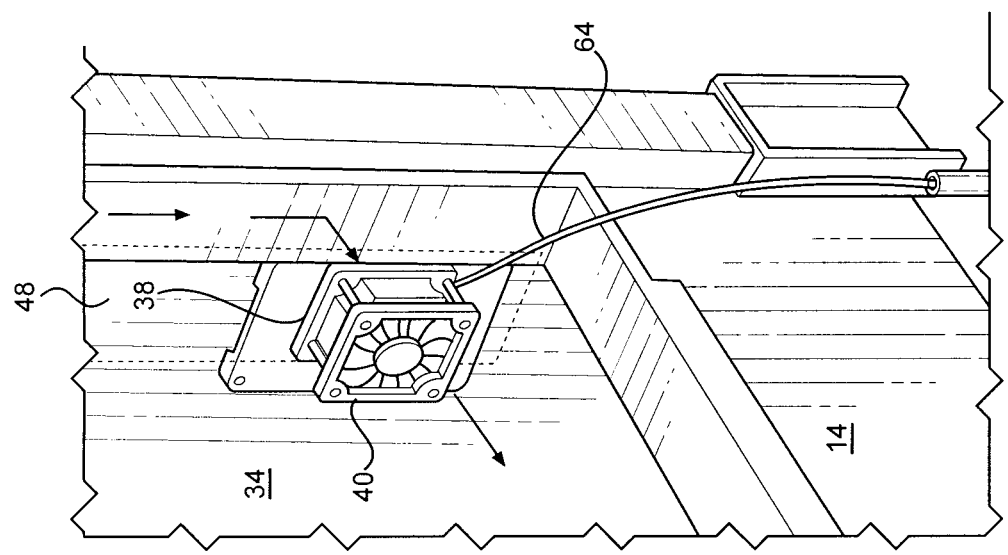
FIG. 6 is a detailed perspective view of a fan disposed proximate to the cool air inlet of the junction box housing, sized to draw cool air from the cool air conduit into the junction box housing, according to an embodiment.

In this regard, FIG. 6 is a detailed perspective view of the fan 40 of the closed loop cooling system 28 disposed proximate to the cool air housing inlet 38 of the junction box housing 14. In this embodiment, the fan 40 is powered by the electrical equipment 54 in the junction box housing 14 or other components, via an electrical cable 64. The fan 40 in this embodiment is disposed directly in front of the cool air housing inlet 38, such that the fan 40 completely covers the cool air housing inlet 38. This arrangement has been found to be an efficient way to maximize the CFM rate of the fan 40, which in turn increases the amount of cool air that is drawn into the junction box housing 14 and the amount of warm air that is forced out of the junction box housing 14. While the fan 40 can be located anywhere along the path of the closed loop cooling system 28, locating the fan 40 proximate the cable conduit 50 may be more difficult, due to the presence of electrical cables 56 occupying and/or extending from the cable conduit 50. Thus, in this embodiment, locating the fan 40 over the cool air housing inlet 38 increases the operating efficiency of the flow of air through the closed loop cooling system 28.

Turning now to FIG. 7, a method 100 of operating a closed loop cooling system for a junction box in a vehicle is disclosed. The method 100 comprises conveying cool air having a first temperature from a compartment interior volume of a storage compartment of a vehicle, such as the compartment interior volume 30 of the embodiments of FIGS. 1-6, into a cool air duct interior volume, such as the cool air duct interior volume 33 of the embodiments of FIGS. 1-6 (Block 102). The cool air duct interior volume is in fluidic communication with the compartment interior volume and a housing interior volume of a junction box housing of the vehicle, such as the housing interior volume 34 of the embodiments of FIGS. 1-6, and the method further comprises conveying the cool air from the cool air duct interior volume into the housing interior volume (Block 104). The method further comprises conveying warm air having a second temperature higher than the first temperature from the housing interior volume into a warm air duct interior volume, such as the warm air duct interior volume 37 of the embodiments of FIGS. 1-6, in fluidic communication with the housing interior volume and the compartment interior volume (Block 106). The method further comprises conveying the warm air from the warm air duct interior volume into the compartment interior volume (Block 108) to complete the loop. In this manner, heat is efficiently removed from the junction box housing and its internal components without introducing moisture, dust, or other contaminants into the junction box housing.

While the invention has been described herein in reference to specific aspects, features, and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and subcombinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A closed loop cooling system for a junction box in a vehicle, the system comprising:
   a junction box housing sized to house electrical equipment in a vehicle, the junction box housing forming a housing interior volume;
   a storage compartment for a vehicle, the storage compartment forming a compartment interior volume;
   a cool air duct coupled between the storage compartment and the junction box housing, the cool air duct forming a cool air duct interior volume in fluidic communication with the compartment interior volume and the housing interior volume, the cool air duct interior volume sized to convey cool air having a first temperature from the compartment interior volume into the housing interior volume; and
   a warm air duct coupled between the junction box housing and the storage compartment, the warm air duct forming a warm air duct interior volume in fluidic communication with the housing interior volume and the compartment interior volume, the warm air duct interior volume sized to convey warm air having a second temperature higher than the first temperature from the housing interior volume into the compartment interior volume.

2. The closed loop cooling system of claim 1, further comprising a fan disposed in the housing interior volume sized to convey one of the cool air and the warm air.

3. The closed loop cooling system of claim 2, wherein the fan is disposed in fluidic communication with a cool air, the cool air duct interior volume, and the housing interior volume to convey the cool air from the cool air duct interior volume into the housing interior volume through the cool air inlet.

4. The closed loop cooling system of claim 1, wherein the junction box housing is sized to house the electrical equipment in the housing interior volume, to facilitate transfer of heat from the electrical equipment to the cool air, to convert the cool air into the warm air.

5. The closed loop cooling system of claim 4, wherein the storage compartment is sized to facilitate transfer of heat from the warm air to source air in the compartment interior volume.

6. The closed loop cooling system of claim 1, further comprising a structural member for providing structural support for the vehicle, the structural member comprising one of the cool air duct and the warm air duct.

7. The closed loop cooling system of claim 6, wherein the structural member comprises a plurality of structural members, the plurality of structural members comprising the cool air duct and the warm air duct.

8. The closed loop cooling system of claim 6, further comprising a cable conduit for receiving a cable therethrough, the cable conduit comprising the other of the cool air duct and the warm air duct.

9. The closed loop cooling system of claim 1, further comprising a cable conduit for receiving a cable therethrough, the cable conduit comprising one of the cool air duct and the warm air duct.

10. The closed loop cooling system of claim 9, wherein the cable conduit comprises a plurality of cable conduits, the plurality of cable conduits comprising the cool air duct and the warm air duct.

11. The closed loop cooling system of claim 1, wherein the compartment interior volume is larger than the housing interior volume.

12. The closed loop cooling system of claim 1, wherein the storage compartment is a baggage hold.

13. The closed loop cooling system of claim 12, wherein the vehicle is a motor coach.

14. The closed loop cooling system according to claim 1, further comprising:
   a fan disposed in the junction box housing disposed in fluidic communication with a cool air inlet, the cool air duct interior volume, and the housing interior volume to convey the cool air from the cool air duct interior volume into the housing interior volume through the cool air inlet;
   a structural member for providing structural support for the vehicle, the structural member comprising the cool air duct; and
   a cable conduit for receiving a cable therethrough, the cable conduit comprising the warm air duct,
   wherein the junction box housing is sized to house the electrical equipment in the housing interior volume, to facilitate heat transfer between the electrical equipment and the cool air to convert the cool air into the warm air,
   wherein the storage compartment is sized to facilitate heat transfer between the warm air and a source air volume in the compartment interior volume to convert the warm air into the cool air,
   wherein the storage compartment is a baggage hold, and
   wherein the vehicle is a motor coach.

15. A method of operating a closed loop cooling system for a junction box in a vehicle, the method comprising:
   conveying cool air having a first temperature from a compartment interior volume of a storage compartment of a vehicle into a cool air duct interior volume of a cool air duct, the cool air duct interior volume in fluidic communication with the compartment interior volume;
   conveying the cool air from the cool air duct interior volume into a housing interior volume of a junction box housing in fluidic communication with the cool air duct interior volume, wherein the cool air is warmed into warm air having a second temperature higher than the first temperature;
   conveying the warm air from the housing interior volume into a warm air duct interior volume in fluidic communication with the housing interior volume and the compartment interior volume; and
   conveying the warm air from the warm air duct interior volume into the compartment interior volume.

16. The method of claim 15, wherein the conveying cool air is performed by a fan disposed in fluidic communication with a cool air inlet, the cool air duct interior volume, and the housing interior volume.

17. The method of claim 15, wherein one of the cool air duct interior volume and the warm air duct interior volume is formed in a structural member for providing structural support for the vehicle.

18. The method of claim 17, wherein the other of the cool air duct and the warm air duct is part of a cable conduit for receiving a cable therethrough.

19. The method of claim 15, wherein one of the cool air duct and the warm air duct is part of a cable conduit for receiving a cable therethrough.

\* \* \* \* \*